US007645342B2

(12) United States Patent
Emerson et al.

(10) Patent No.: US 7,645,342 B2
(45) Date of Patent: Jan. 12, 2010

(54) RESTRICTED RADIATED HEATING ASSEMBLY FOR HIGH TEMPERATURE PROCESSING

(75) Inventors: David Todd Emerson, Chapel Hill, NC (US); Robert Allen Garner, Cary, NC (US); Michael John Bergmann, Chapel Hill, NC (US); Keenan Carlyle Brown, Raleigh, NC (US); Michael Allen Pennington, Cary, NC (US); Thomas Goldthwaite Coleman, Pittsboro, NC (US)

(73) Assignee: Cree, Inc., Durham, NC (US)

( * ) Notice: Subject to any disclaimer, the term of this patent is extended or adjusted under 35 U.S.C. 154(b) by 84 days.

(21) Appl. No.: 11/272,909

(22) Filed: Nov. 14, 2005

(65) Prior Publication Data

US 2006/0130763 A1    Jun. 22, 2006

Related U.S. Application Data

(60) Provisional application No. 60/627,815, filed on Nov. 15, 2004.

(51) Int. Cl.
 *C23C 16/00* (2006.01)
 *C23F 1/00* (2006.01)
 *H01L 21/306* (2006.01)
(52) U.S. Cl. .................................. 118/725; 156/345.52
(58) Field of Classification Search ................. 118/725; 338/283, 284, 285, 28, 287, 288, 289, 290, 338/291, 292, 293, 294, 306, 307, 308, 309; 156/345.52; 219/443, 444.1, 465.1, 466.1, 219/542, 543; 392/386, 387, 388, 389
See application file for complete search history.

(56) References Cited

U.S. PATENT DOCUMENTS

| 4,421,786 | A |   | 12/1983 | Mahajan et al. |
| 4,777,022 | A | * | 10/1988 | Boldish et al. .............. 118/666 |
| 5,059,770 | A |   | 10/1991 | Mahawili |
| 5,343,022 | A | * | 8/1994  | Gilbert et al. ............... 219/552 |
| 5,536,918 | A |   | 7/1996  | Ohkase et al. |

(Continued)

FOREIGN PATENT DOCUMENTS

EP    1 391 919    2/2004

(Continued)

OTHER PUBLICATIONS

Arc. (2007). In The American Heritage® Dictionary of the English Language. Boston, MA: Houghton Mifflin. Retrieved Sep. 19, 2008, from http://www.credoreference.com/entry/6990832/.*

(Continued)

*Primary Examiner*—Parviz Hassanzadeh
*Assistant Examiner*—Maureen Gramaglia
(74) *Attorney, Agent, or Firm*—Summa, Additon & Ashe, P.A.

(57) ABSTRACT

A vapor deposition reactor and associated method are disclosed that increase the lifetime and productivity of a filament-based resistive-heated vapor deposition system. The reactor and method provide for heating the filament while permitting the filament to move as it expands under the effect of increasing temperature while limiting the expanding movement of the filament to an amount that prevents the expanding movement of the filament from creating undesired contact with any portions of the reactor.

6 Claims, 8 Drawing Sheets

U.S. PATENT DOCUMENTS

| | | | |
|---|---|---|---|
| 5,688,331 A * | 11/1997 | Aruga et al. | 118/725 |
| 5,759,281 A * | 6/1998 | Gurary et al. | 118/725 |
| 5,911,896 A * | 6/1999 | Holden et al. | 219/390 |
| 6,025,575 A | 2/2000 | Park et al. | |
| 6,153,522 A | 11/2000 | Takagi et al. | |
| 6,368,404 B1 | 4/2002 | Gurary et al. | |
| 6,492,625 B1 | 12/2002 | Boguslavskiy et al. | |
| 6,506,252 B2 | 1/2003 | Boguslavskiy et al. | |
| 6,547,876 B2 * | 4/2003 | Ferguson et al. | 117/88 |
| 6,582,780 B1 * | 6/2003 | Tolt | 427/587 |
| 2002/0195441 A1 | 12/2002 | Kariya | |
| 2003/0121898 A1 | 7/2003 | Kane et al. | |
| 2003/0124820 A1 * | 7/2003 | Johnsgard et al. | 438/482 |
| 2005/0045618 A1 * | 3/2005 | Ito | 219/444.1 |
| 2005/0133159 A1 | 6/2005 | Johnsgard et al. | |
| 2006/0157472 A1 | 7/2006 | Mashima et al. | |

FOREIGN PATENT DOCUMENTS

| | | |
|---|---|---|
| EP | 1 406 472 | 2/2004 |
| TW | 569643 | 1/2004 |
| WO | WO 02/084710 | 10/2002 |
| WO | WO 2004/019658 | 3/2004 |
| WO | WO 2004019658 | 3/2004 |

OTHER PUBLICATIONS

J. Brothier, Authorized Officer, International Search Report for International Application No. PCT/US2005/040786, Mailed Mar. 21, 2007, 3 pages.

ROC (Taiwan) Search Report for foreign counterpart application No. 094140105, completed Sep. 23, 2008, 2 pages.

* cited by examiner

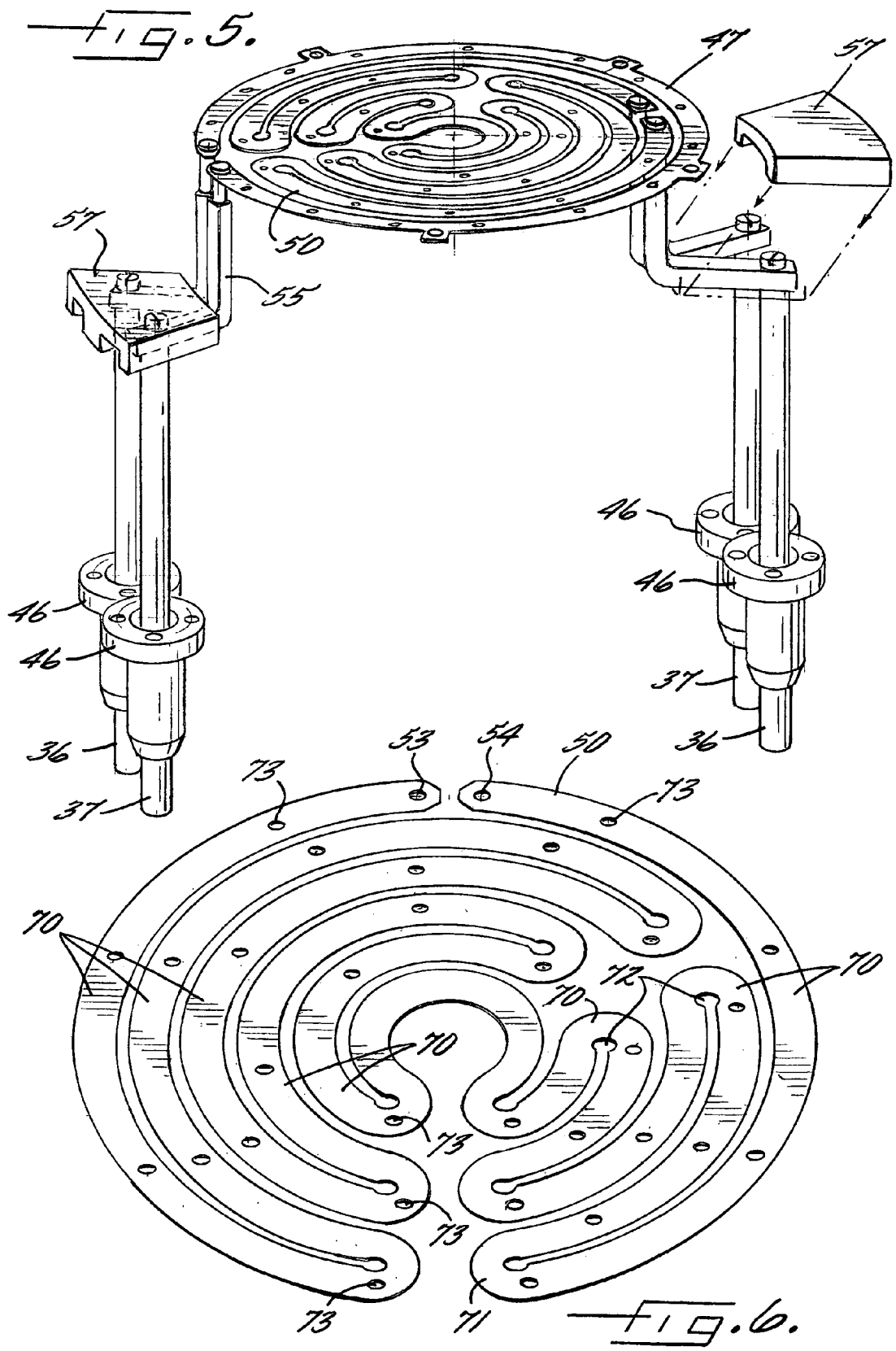

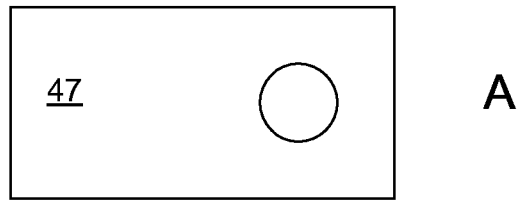
A
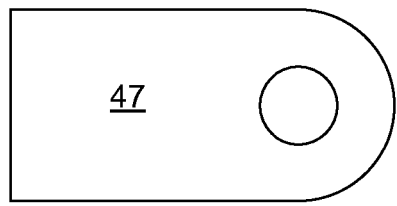
B
Fig. 13
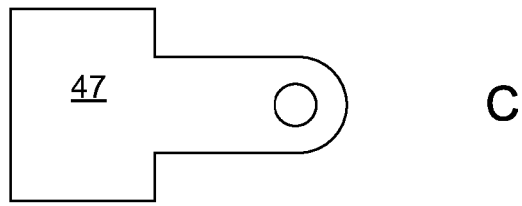
C
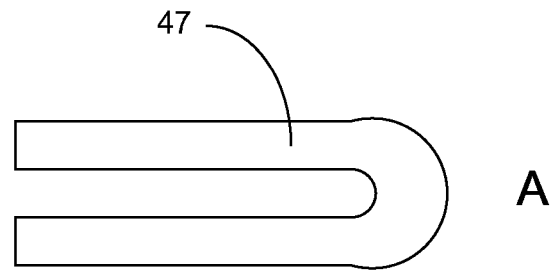
A
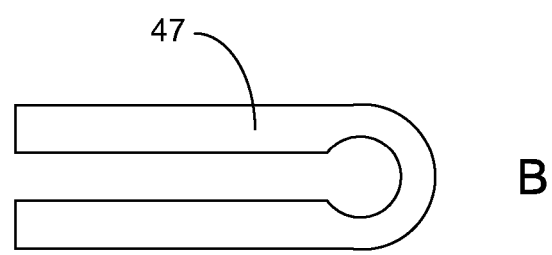
B
Fig. 14
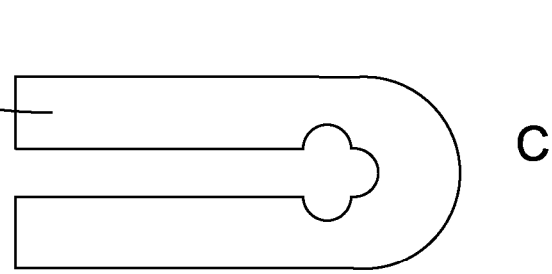
C

RESTRICTED RADIATED HEATING ASSEMBLY FOR HIGH TEMPERATURE PROCESSING

This application claims priority from application Ser. No. 60/627,815 filed Nov. 15, 2004.

BACKGROUND

The present invention relates to vapor deposition techniques for material growth and in particular relates to chemical vapor deposition growth of epitaxial layers of semiconductor materials.

The term "vapor deposition" is used to refer to a number of techniques in which gas phase precursors condense or react to form a layer of a desired material on a substrate. Similarly, the phrase "chemical vapor deposition" ("CVD") is often used to refer to a growth technique in which gas compositions react on a substrate surface to produce a desired product in the form of a high purity; high crystal quality epitaxial layer. Such layers are required for a number of semiconductor devices including, but not limited to, light emitting diodes ("LEDs").

The physical and chemical characteristics of many semiconductor materials requires that their growth using CVD or related techniques be carried out at relatively high temperatures. For example, semiconductors such as gallium nitride (GaN) and associated Group III nitrides typically require CVD growth temperatures of at least about 600° C. Accordingly, the equipment used to carried out epitaxial growth must be able to generate, control and withstand such temperatures.

In relatively broad (but not limiting terms) a CVD reactor for epitaxial semiconductor growth typically includes a reaction chamber that can be evacuated to produce and control low gas pressures; a heating system; an inlet for reactant gases and an outlet for product gases; and some physical support (often a rotating support) for the substrate wafer(s) or wafer carrier(s) upon which growth will take place.

Several broad categories of heating techniques and systems are typically used for chemical vapor deposition. These include, but are not limited to, radio frequency (induction) heating; radiative heating; and resistive heating. The present invention relates to resistive heating.

Resistive heating is carried out by passing a current through a conductive filament, typically formed of particular metals, alloys, or other satisfactory materials (e.g. graphite). Although conductive, the filament is also selected so that a sufficient voltage applied to it will generate a current that heats the filament to relatively high temperatures. The filament will in turn heat the reactor, the growth substrate, and the reactants to the desired or necessary deposition temperatures.

Each of these heating techniques has inherent advantages and disadvantages. Ease of application is one advantage provided by resistive heating. The resistive element—i.e., the filament—is placed in close proximity to the sample to be heated (typically a semiconductor wafer or a carrier for semiconductor wafers). Direct or alternating current is applied to the filament and, as noted above, the element becomes hot as a function of the resistance of the filament and the current flowing through it. As the filament increases in temperature, it in turn heats the sample based upon the temperature of the filament and the distance between the filament and the sample.

Nevertheless, resistive heating also presents some inherent disadvantages. First, the filaments tend to expand at the high temperatures typically required for CVD. Such expansion frequently leads the filament to become distorted because of the difference in thermal properties (including coefficient of thermal expansion) between the filament and the various other components in the reactor. Such deformation can change the characteristics of the reactor's behavior from run to run and can reduce the lifetime of the heating assembly.

Second, resistive heating often creates large thermal gradients across portions of the reactor assembly. For example, in resistive heated deposition reactors, temperature changes of 500° C. or higher can occur across distances as small as 3 inches (75 mm). These large gradients can lead to cracking in the components.

Third, the electrodes that carry current to the filament are typically exposed to the growth environment and thus to the reactants, products, and by-products at high temperatures. As a result, undesired materials can accumulate on the electrodes and the electrodes can become electrically shorted to one another or to other components of the reactor.

Fourth, in some types of systems, the filaments are permitted to move inside of the growth apparatus as they expand and can form undesired electrical shunts (short circuits) with other components in the reactor. Additionally, such expansion can cause undesired contact between different portions of the same filament. Although not necessarily causing a short circuit, such filament self-contact can change the current flow (and thus the temperature) though the filament and lead to loss of temperature control or early degradation. These problems can become exacerbated when, as is typical in many reactors, more than one filament is used.

As another factor, the number of components required in a resistive heating assembly is relatively high providing a corresponding set of opportunities for component failure and overall difficulty.

As a specific example, resistive-heated chemical vapor deposition is one technique used to grow epitaxial layers of Group III nitrides on silicon carbide (SiC) substrates. In turn, such multiple epitaxial layers of Group III nitrides form the basis for light emitting diodes and diode lasers that, because of the wide bandgap of the Group III nitrides, can produce high frequency emissions in the blue, violet and ultraviolet portions of the electromagnetic spectrum. In turn, the ability to produce light at these frequencies offers the further opportunity to either drive phosphors that will emit white light or to combine blue emitting diodes with those emitting red and green light to produce white light within the visible spectrum.

In typical (but not limiting) techniques for growing Group III nitrides layers, a CVD reactor is typically used for between about four and five hours at a time to produce the desired layers of epitaxial growth. When one set is complete, the wafers or wafer carriers are removed from the chamber and are replaced with the next set of wafers upon which deposition is to be carried out. Each such cycle is commonly referred to as a "run," and in conventional resistive-heated deposition reactors, between about 20 and 100 runs can be carried out before the chamber and its components must be cleaned, replaced, or both. Ordinary cleaning takes at least about two hours and more complex maintenance, considerably longer. The cumulative problems in resistive heating that have been noted herein tend to increase the frequency with which such maintenance or repair must take place.

As in any production technique, of course, reducing the frequency of disassembling, cleaning, or maintaining equipment corresponds to an increase in productivity and efficiency.

Accordingly, increasing the efficiency and throughput of such vapor deposition systems, and decreasing the frequency of maintenance and downtime, while maintaining the advantages of resistance heating, remains a worthwhile and desired goal.

SUMMARY OF THE INVENTION

In one aspect, the invention is a conductive filament for resistive heating in vapor deposition that comprises a cathode contact and an anode contact, a plurality of concentrically adjacent arc-shaped portions between the contacts that define corresponding arc-shaped openings therebetween, a plurality of respective turns connecting pairs of the arc-shaped portions, with at least one of the turns having a width across the filament at the turn that is less than the width across the adjacent arc-shaped portions for reducing the difference in resistance between the inner and outer edges of the turn as current flows through the filament between the contacts.

In another aspect, the invention is a filament that includes a cathode contact and an anode contact, and annular metal portion between the contacts that forms most of a continuous circle while defining a small gap along the circumference of the circle that separates the contacts from one another and provides a current path between the contacts on a voltage is applied to the filament. The filament includes a plurality of non-circular closed plain curved openings along the continuous circle for receiving pin supports therethrough and for permitting the filament to move against, but not beyond, the pins as the filament expands and contracts.

In another aspect, the invention is a resistive-heated vapor deposition reactor that includes a reaction chamber, a gas inlet into the chamber and a gas outlet from the chamber, and at least one conductive filament in the chamber. The reactor includes means for preventing the conductive filament from unrestricted expansion and from contacting undesired portions of the reactor when the filament expands and contracts under the influence of applied current and resulting temperature changes.

In yet another aspect, the invention is a method of increasing the lifetime and productivity of a filament-based resistive-heated vapor deposition system. In this aspect the invention includes the steps of heating the filament while permitting the filament to move as it expands under the effect of increasing temperature and while limiting the expanding movement of the filament to an amount that prevents the expanding movement of the filament from creating undesired contact with any portion of the reactor, including the filament itself.

In another aspect, the invention is a conductive filament having a cathode contact and an anode contact and a rotational symmetry of order n, where n is at least 2, for minimizing the number of shapes the filament presents to current flowing therethrough during resistive heating.

In another aspect, the invention is a vapor deposition reactor that includes a reaction chamber, at least one conductive filament in the chamber, a pair of electrodes in the chamber and in electrical contact with the conductive filament, and insulating protective covers on portions of the electrodes for preventing deposition reactants, products and byproducts from undesirably contacting the electrodes.

In yet another aspect, the invention is a resistive-heated vapor deposition reactor that includes a reaction chamber, at least one conductive filament in the chamber, at least one heat shield between the filament and the floor of the reaction chamber for reducing heating away from the growth area of the chamber, the heat shield being thermally and chemically inert with respect to the other materials in the reactor, and a plurality of heat shield supports fixed, but not necessarily permanently, to the floor of the reaction chamber and to the heat shield for limiting the temperature-induced expansion movement of the heat shield in any manner that prevents the heat shield from coming into undesired contact with the filament or other portions of the reactor.

The foregoing and other objects and advantages of the invention and the manner in which the same are accomplished will become clearer based on the followed detailed description taken in conjunction with the accompanying drawings.

BRIEF DESCRIPTION OF THE DRAWINGS

FIG. 5 is another partial perspective view of a portion of a reactor according to the invention including the electrodes, straps, and filaments.

FIGS. 6 through 11 illustrate various filament shapes according to the present invention.

FIG. 13 illustrates additional embodiments of the anode and cathode contacts for filaments according to the present invention.

FIG. 14 illustrates additional embodiments of the filament turns for filaments according to the present invention.

DETAILED DESCRIPTION

Figure 1:
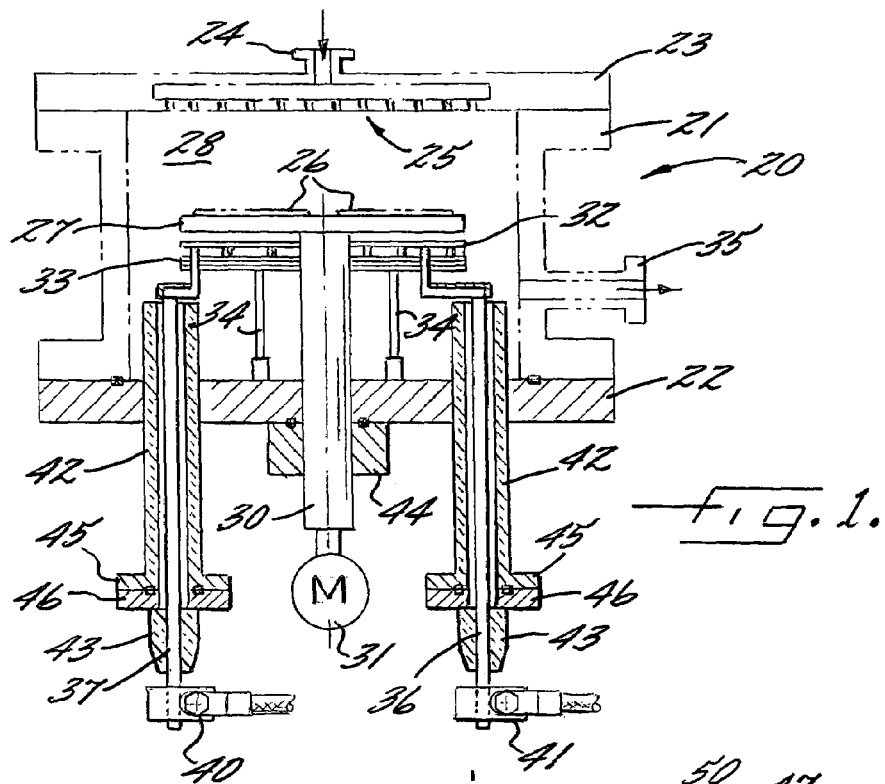
FIG. 1 is a cross-sectional view of a vapor deposition reactor of the type used in accordance with the present invention.

FIG. 1 is a cross-sectional view of a vapor deposition reactor broadly designated at 20. Although the invention will be described with respect to the figures, those of skill in this art will recognize that a number of variations on the exact type and style of the reactor can be used while still incorporating the claimed invention. Accordingly, FIG. 1 and the other figures herein, are exemplary rather than limiting of the invention.

The reactor 20 is generally cylindrical in shape and includes annular walls 21, a circular floor or base plate 22, and a circular top portion 23 that together define a chamber 28. In the style of reactor illustrated in FIG. 1, the top portion 23 also includes a gas inlet 24 and a manifold broadly designated at 25 (sometimes referred to as a "shower head") for more evenly distributing incoming gases into the chamber 28 and across the substrates 26 upon which deposition growth is to take place.

The substrates 20 typically rest on a substrate support 27, and because the substrates 26 are usually semiconductor wafers, the support 27 is a typically a wafer carrier (with indented portions to maintain the wafers in place). In turn, the wafer carrier 27 is supported on a spindle 30 that is driven by a motor 31 to rotate the wafer carrier 27 and the wafers 26 during deposition growth. Again, those of skill in this art are familiar with this technique, and will recognize that the rotation takes place over a wide range of speeds, from a few tens of revolutions per minute (rpm) to several thousand rpm, with 1000 rpm being typical.

In order to heat the wafers 26, the reactor includes at least one conductive filament 32 in the chamber 28 that is defined by the reactor walls. Although the term filament will be used herein, those of skill in this art will recognize that other terms such as "heating element" are likewise used to describe the same part and its same function.

As illustrated herein, the filaments are substantially planar and circular in an overall (but not exact) sense. The planar design provides efficient heat transfer between the filament and the items or materials being heated, and the circular shape both matches the parameters of the reaction chamber and helps current flow more efficiently though the filament.

At least one heat shield 33 (perhaps best illustrated in FIGS. 2 and 3) is present in the chamber 28 between the filament 32 and the floor 22 of the reaction chamber 28 for reducing heating away from the growth area of the chamber. The heat shield 30 is thermally and chemically inert with respect to the other materials in the reactor, including the gas-phase reactants, products, and by-products. In one embodiment of reactors according to the invention the heat shield 33, and typically a plurality of heat shields as described below, is supported by a plurality of heat shield supports 34, which can also be referred to as "stand-offs." The heat shield supports 34 are fixed, although not necessarily permanently, to the floor 22 of the reaction chamber 28 and to the heat shield or shields 33 for limiting the temperature-induced expansion movement, either horizontally or vertically, of the heat shield in any manner that prevents the heat shield 33 from coming into undesired contact with the filament 32 or with other portions of the reactor 20.

In preferred embodiments, the reactor 20 will include at least two heat shields each of which may be formed of a material different from the other in order to obtain desired composite properties. For example, the heat shield closest to the filament 32 is selected or tailored for its heat resistance or reflectance properties, while those beneath and supporting the upper heat shields can be selected for other structural advantages. The heat shields are preferably formed of materials selected from the group consisting of molybdenum, titanium zirconium molybdenum alloy ("TZM"), tungsten, quartz, boron nitride, sapphire, and silicon carbide. The heat shields are placed in close proximity to one another with a 0.05-0.1 inch (1.2-2.5 mm) separation being typical. Spacers (FIGS. 3A and 4) between the heat shields maintain them in the desired positions.

As at least partially illustrated by FIG. 1, reactant gases flowing into the chamber 28 through the inlet 24 and the manifold 25 are heated by the filament 32 as are the wafers 26. Following the appropriate reaction and deposition, the by-product gases can exit the chamber 28 through a gas outlet 35.

Figure 2:
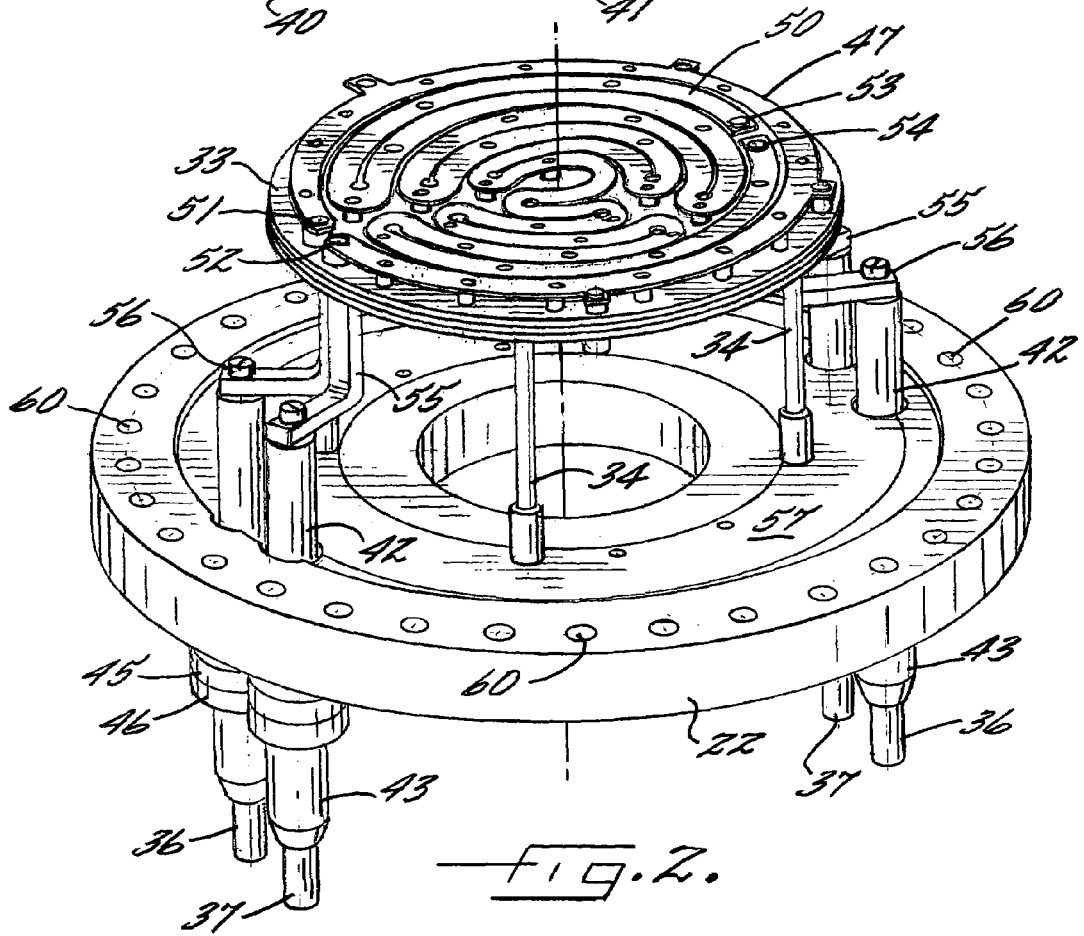
FIG. 2 is a perspective view of portions of the floor of the reactor of FIG. 1 along with portions of the heat shields and filaments.

FIG. 1 also illustrates that each filament 32 in the chamber is in electrical contact with a respective pair of electrodes 36 and 37 that are also illustrated in FIG. 2 and other of the drawings. In normal fashion, one of the electrodes serves as the anode and the other as the cathode for applying either a direct or alternating current to the filaments to create the desired heating effect. In turn, the electrodes 36, 37 are connected to an appropriate power supply (not shown) through the conductive fasteners 40 and 41.

FIG. 1 also illustrates respective ceramic insulating covers 42 and 43 on portions of the electrodes 36 (which are typically formed of copper). The ceramic covers 42, 43 on the electrodes prevent deposition reactants, products and by-products from undesirably contacting the electrodes during growth processes. By avoiding such contact, the covers 42, 43 help prevent the creation of undesired shunts or short circuits between and among the electrodes and other items in the reactor 20 and thus increase the lifetime of the reactor between cleaning cycles and similar maintenance. Exemplary (but not limiting) materials for the covers 42, 43 can include alumina, sapphire, and boron nitride.

FIG. 1 illustrates the ceramic electrode covers as being a single piece that extends from the portions inside the chamber 28 through the floor 22 and toward or to the flanges 45, 46. It will be understood, however, that the ceramic insulators can also be comprise several separate portions, for example a portion inside the chamber 28 combined with a vacuum seal at the floor 22 to accomplish the same purpose.

Although not illustrated in FIG. 1, those of skill in this art recognize that chemical vapor deposition, particularly for high quality epitaxy, is carried out in optimized and carefully controlled reaction environments at both low and high pressures. Thus, the reactor 20 must be able to contain and withstand such low pressures and in turn the elements of the reactor 20 that have portions both inside and outside of the chamber 28 (such as the electrodes 36, 37 and the spindle 30) must be carefully sealed to avoid loss of control over the desired low-pressure environment. Accordingly, a vacuum collar 44 surrounds the spindle 30 to maintain the vacuum integrity of the chamber 28 and the flanges 45 and 46 are used for similar purposes to control pressure at the electrodes 36 and 37.

FIG. 2 illustrates these and other aspects of the invention in different and additional detail. First, FIG. 2 shows that the reactor 20 typically includes at least two, and sometimes up to five, filaments. FIG. 2 illustrates an outer filament 47 and an inner filament 50 (the outer filament is also illustrated in more detail in FIGS. 3 and 11). The outer filament 47 includes respective anode and cathode contacts 51 and 52 and the inner filament includes anode and cathode contacts 53 and 54.

The contacts in turn are physically and electrically connected to respective conductive straps, all of which are designated at 55. The straps 55 provide a physical and electrical contact between the respective filaments 47 and 50 and the electrodes 36 and 37. In the illustrated embodiment, the conductive straps 55 have respective horizontal and vertical portions that form an L-shape for positioning the filaments 47, 50 in electrical contact with the electrodes 36, 37 other than in direct alignment with the electrodes 36, 37. This enables different sizes of filaments to be used in the same reactor without requiring the electrodes to be permanently or temporarily repositioned. In particular, the size and shape of the straps 55 can be selected to match a variety of filament sizes and shapes and to connect them with the electrodes 36, 37 with relative ease. In preferred embodiments, the conductive straps 55 can be rigid or flexible and are formed such that they are of lower resistance than the filaments 47, 50. Since resistance is a function of both resistivity and geometry of the strap material, the low resistance is achieved through proper selection of material as well as proper design of the straps. Such low resistance of the straps in comparison to the filaments helps minimize excessive heating in the growth chamber at regions other than the growth area without the addition of water or other cooling to portions of the heating assembly within the growth chamber. Preferred strap material includes tungsten, molybdenum, and rhenium. Preferred materials include tungsten or rhenium.

FIG. 2 also illustrates the heat shield supports 34 which in the illustrated embodiment are fastened to a mounting plate 57 that is annular in shape and that can be removed (along with the supports 34) from the floor 22 of the chamber 28. This permits another mounting plate that is otherwise of the same size, but that carries different heat shields and filaments, to be readily substituted in the reactor 20. In another embodiment, the heat shield supports 34 may be connected directly to the floor 22 of the chamber 28.

FIG. 2 also illustrates appropriate openings 60 through which bolts or other fastening devices can be inserted to fix the floor 22 of the reactor 20 to the annular walls 21 in the relationship illustrated in FIG. 1. The floor 22 may also be attached to the chamber 28 by means of clamps, straps, or other appropriate attachment mechanism.

Figure 3:
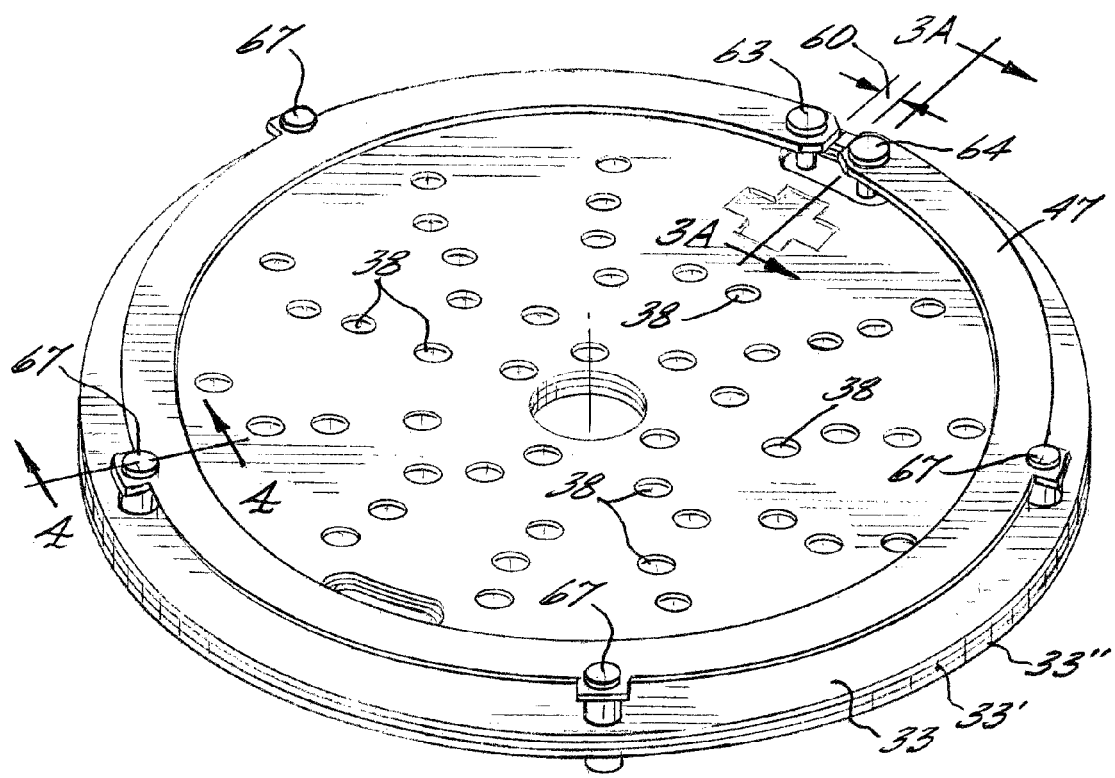
FIG. 3 is a perspective view of a heat shield and a filament according to the present invention.

FIG. 3 illustrates one embodiment of an outer filament 47 in greater detail. FIG. 3 shows the outer filament 47 in context above a plurality of heat shields 33, three of which are illustrated. The filament 47 includes a cathode contact and an anode contact which are formed of openings adjacent one another in the annular filament 47. In this embodiment, the filament 47 forms most of a continuous circle while defining a small gap illustrated at 60 along the circumference of the circle that separates the contacts from one another and provides a current path between the contacts when a voltage is applied to the filament 47.

Figure 11:
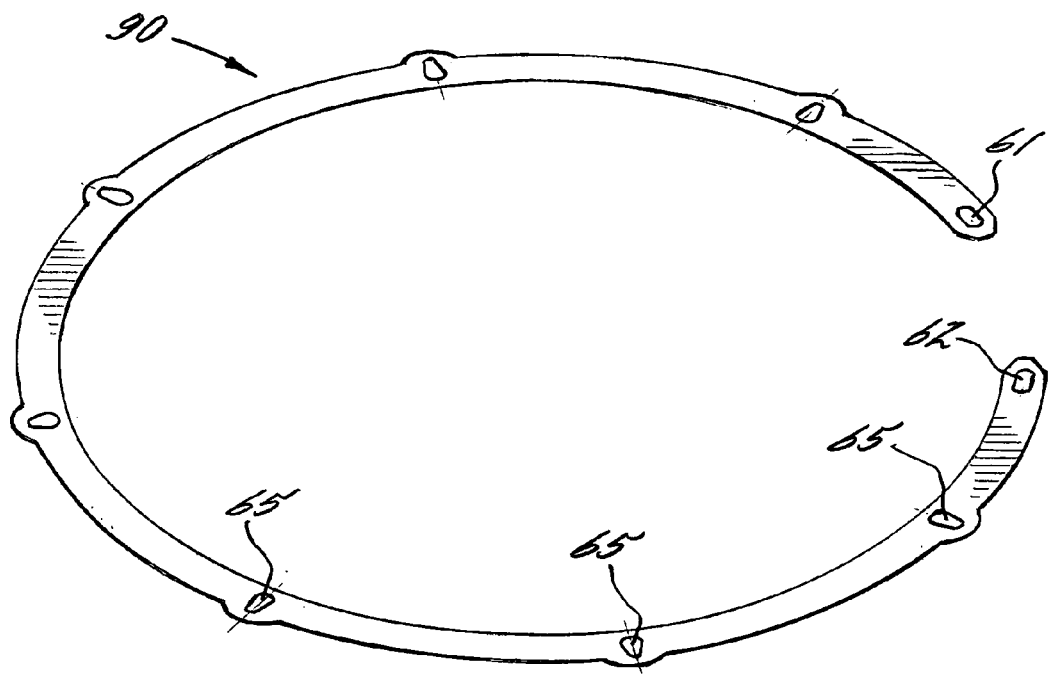

As is illustrated with respect to FIG. 11 and some of the other drawings, the contacts are in the form of small openings 61, 62 through which conductive bolts 63 and 64 (FIG. 3) are inserted to complete the electrical contact. As can be seen in FIG. 3.1, a cross-sectional view of FIG. 3 taken along line 5-5, the filament is bolted to the conductive strap via a conductive bolt. This assembly is isolated from the heat shields either via a suitably selected insulating material.

Figure 4A:
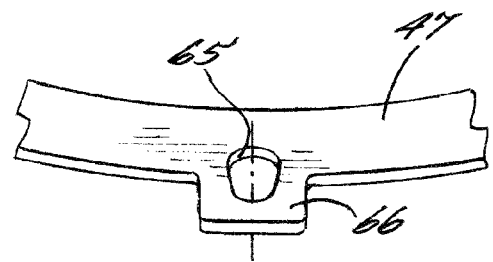
FIG. 4A is a partial cutaway view of a portion of the filament of FIG. 3 and FIG. 4.
Figure 4:
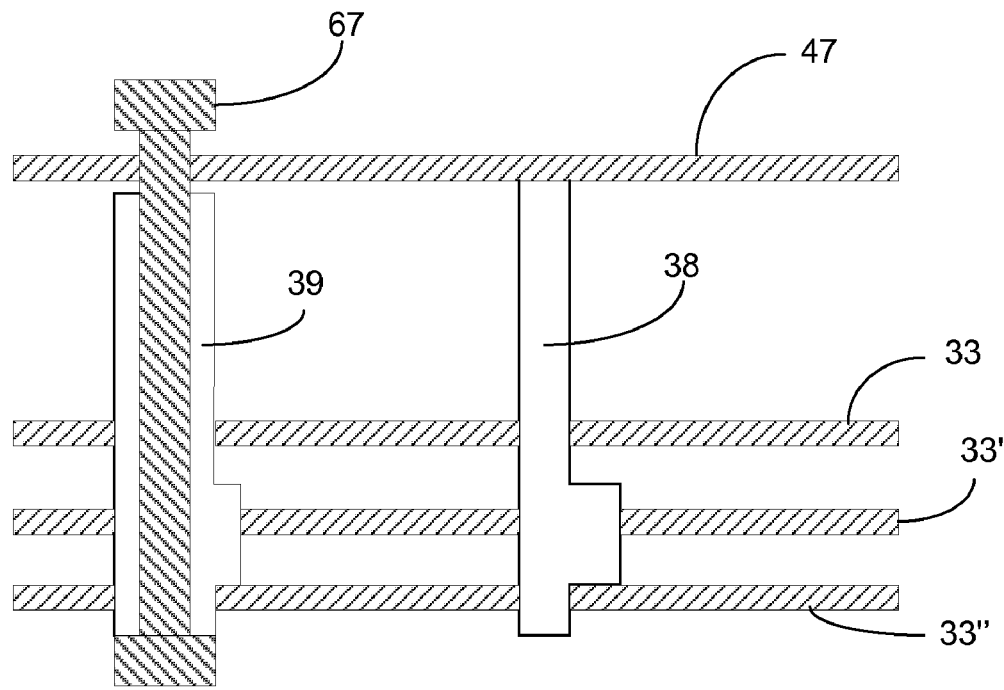
FIG. 4 is a cross-sectional view taken along lines 4-4 of FIG. 3.

Also as illustrated with respect to FIG. 11 and some of the other drawings, the movement of the filament 47 is selectively restricted through the appropriate use of pins 67 inserted through holes 65 in the filament 47 and into insulating anchors 69 fixed loosely to one or more of the supporting heat shields 33. In the combination of pins 67 and anchors 69, one of the pin/anchor pair can be conducting, but not both. Some of these aspects are also illustrated in FIG. 4 in which one of the pins 67 is shown in a cross-sectional view taken along lines 4-4 of FIG. 3. FIG. 4, together with FIG. 4A illustrates that the filament 47 defines a plurality of closed plane curved openings 65. These openings (which are curved, but do not necessarily form a single geometric curve such as an ellipse or a circle), receive the pin 67 therethrough. Because each opening 65 is bigger than the corresponding pin 67, the plurality of openings 65 permit the filament 47 to move against but not beyond the pins 67 as the filament 47 expands and contracts. In a preferred embodiment, these openings are non-circular with the specific shape chosen by the ultimate filament temperature and filament geometry. The material of the pin/pin anchor combination should be chosen to prevent current from flowing from the filament, through the pin and the pin anchor, and subsequently into the heat shield. Accordingly, at least one of the pin and pin anchor pair should be made of an insulating material such as alumina, boron nitride, or sapphire. The other component may be made of a conductive material such as tungsten, TZM, molybdenum, or rhenium.

FIG. 4 also illustrates that the heat shields 33, 33', and 33" are spaced apart from one another (to avoid conducting heating among them) and are maintained in the spaced relationship by respective insulating supports 38. The pin 67 (which in other embodiments may be in the form of a nut and bolt) is also insulated with an insulating cover 39. Alternatively, the pin 67 itself may be formed of an appropriate insulating material.

Figure 3A:
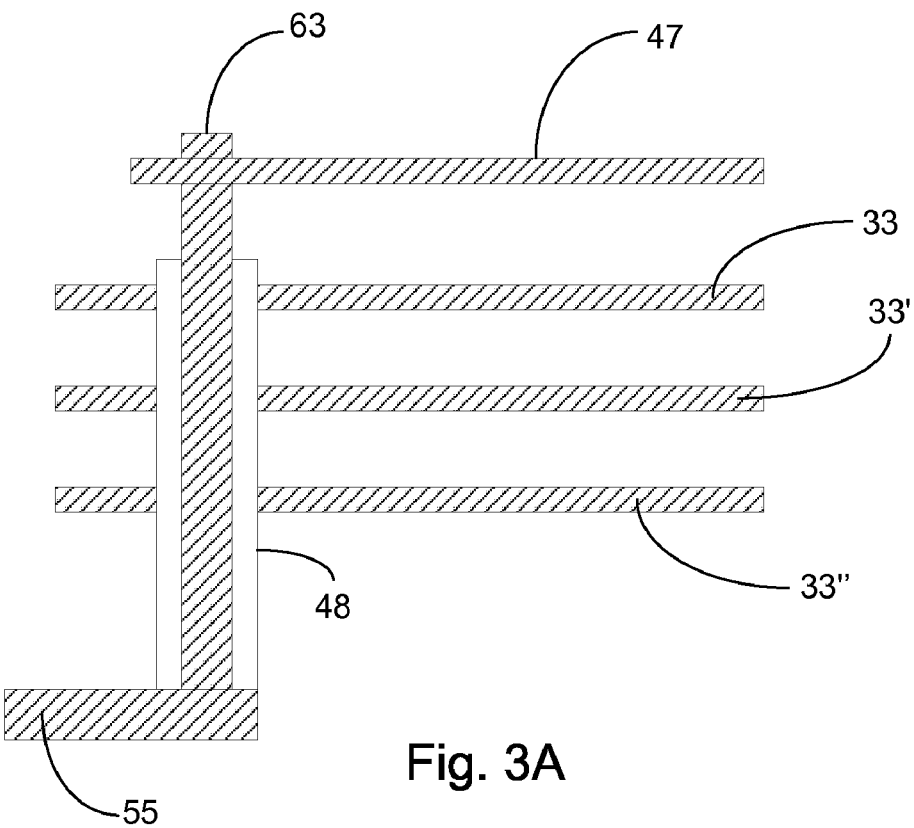
FIG. 3A is a cross section taken along lines 3A-3A of FIG. 3.

FIG. 3A illustrates the conductive connection in cross section and shows the conductive pin (or bolt) 63 along with the filament 47 and the heat shields 33, 33', and 33". The conductive pin 63 is in contact with the strap 55 and is electrically insulated from the heat shields by the insulating cover 48.

FIG. 4A illustrates that in one embodiment, the filament 47 includes a plurality of tab portions 66 that extend outwardly from the perimeter of the annular filament 47 and with the non-circular closed plane curved openings 65 being located in the tabs for providing a less complex current flow path through the filament 47 in the presence of the openings 66. Although in the illustrated embodiment (FIG. 3) the filament 47 has four of the pin holes, it will be understood that this is illustrative rather than limiting and that a larger or smaller number of holes and pins can be used consisted with the function of permitting some, but not unlimited, free expansion of the filament during heating.

As illustrated in FIG. 3 and elsewhere, in most embodiments the conductive filaments of the invention will have a flat rectangular cross-section. Although the invention is not limited to the flat cross-section, and other shapes can be used, the flat rectangular cross section provides an efficient structure for radiating heat towards the growth substrate, particularly in the presence of the heat shields.

Similarly, filaments according to the invention are typically formed of a material selected from the group consisting of (but not limited to) tungsten, rhenium, graphite, boron nitride, nickel chromium, iron nickel chromium, and silicon carbide.

The contacting pins 63 and 64 are formed of an electrically conductive material, while the pins 67 used to constrain expansion are preferably heat-resistant and electrically insulating to avoid interfering with current flow through the filament 47 and they likewise electrically insulate the filament 47 from the heat shield 33 and from other portions of the reactor 20.

FIG. 3 also illustrates some of the potential relationships between the heat shields 33 and the pins 67. In particular, FIG. 3 illustrates a stack of three heat shields 33, 33', and 33". These are also illustrated in cross-section in FIG. 4. For a number of reasons, in the illustrated embodiments the top heat shield 33 is not physically attached to the pins 67, but instead includes the numerous openings illustrated at 38 (only some of which carry reference numerals for clarity's sake) through which the pins 67 supporting the filaments extend. Not all of the openings 38 are necessarily associated with pins 67 whose purpose is to restrict the motion of the filament. Some of them are present to locate filament supports to physically support the filament in the vertical direction while having no intentional effect on the horizontal movement of the filament. In the locations 38 whose purpose is to fix the motion of the filament in the horizontal direction, the pins 67 can comprise the rivet-like arrangement (FIG. 4) that passes through all three of the heat shields. Alternatively, (and not illustrated), one of the lower two heat shields 33' or 33" can form a structure in which the desired number of pins are fixed to its surface and extend upwardly. In either case, the top heat shield 33 fits over the upwardly extending pins 67 and rests upon the lower heat shields 33' and 33".

There is no particular theoretical limit to the number of heat shields, but from practical standpoint two or three usually suffice to provide the desired combination of properties with five being a typical (but not absolute) maximum.

Similarly, although there is no theoretical limit to the number of filaments in the chamber 28, practical limitations make the use of between two and five most convenient. If each individual filament is individually controlled, the thermal profile generated by the filaments can likewise be controlled to in turn help control the overall thermal profile of the chamber during deposition growth. Such arrangements and adjustments are well understood by those of ordinary skill in this art and will not the otherwise described in detail herein.

FIG. 5 illustrates additional aspects of the invention, including the outer 47 and inner 50 filaments, the electrodes 36, 37, and the conductive straps 55. FIG. 5 also illustrates a pair of insulating strap covers 57 that are positioned on the horizontal portions of the conductive straps 55. The insulating strap covers 57 protect the straps 55 from coming into contact with undesired materials that might otherwise cause a shunt or short circuit between the straps 55 themselves (and thus between the electrodes 36, 37) or between the straps and other electrically conductive portions of the reactor. In particular, given the rotation speed of typical wafer supports as described above, wafers can occasionally become dislodged from the wafer carrier. Given that such wafers are usually either conductive or semiconductive, they can strike the electrodes 36, 37 or the straps 55 and create the undesired shunts or short circuits. Such a short circuit, of course, immediately ruins the ongoing run and can damage the straps, the electrodes or other parts of the reactor. The insulating strap covers 57 can be designed so as to insulate the vertical parts of the conductive straps 55 and electrodes 36,37.

FIG. 6 illustrates one embodiment of a conductive filament according to the present invention. The filament includes the cathode and anode contacts 53 and 54 in the form of small holes through which electrical contact can be made to the filament 50. The filament is formed of a plurality of generally concentric and adjacent arc-shaped portions 70 between the contacts 53, with the arc shaped portions 70 defining arc shaped openings in between.

A plurality of turns 71 connect respective pairs of the arc shaped portions 70. Each of the turns has a width across the filament 50 at the turn 71 that is less than the width across the adjacent arc-shaped portions 70 for reducing the difference in resistance between inner and outer edges of the turn 71 as current flows through the filament 50 between the contacts 53, 54.

Stated differently, because in most circumstances the filament 50 has a uniform composition throughout, the resistance through any portion of the filament is directly proportional to the length of that portion. As a result, because the length around the inner circumference of a turn 71 is less than the length around the outer circumference of a turn 71, the resistance at the inside circumference of the turns 71 is less than the resistance at the outside circumference. As a result, current flows more easily along the inner circumference of the turns 71 than it does along the outer circumference. The difference in current flow can be significant and can cause a correspondingly significant temperature difference. In turn, the temperature difference across the turn 71 can cause the expansion, distortion, damage and degradation problems that the invention moderates or eliminates. Accordingly, incorporating the larger inner circumference indicated at 72 in each of the turns reduces the resistance difference, the current flow difference, and the temperature difference across the turn 71.

As FIG. 6 illustrates, in typical embodiments the anode and cathode contacts 53, 54 comprise openings adjacent one another and adjacent a small gap that defines the two ends of the filament for current flow purposes.

Accordingly, in the illustrated embodiment, which is exemplary rather than limiting, the filament includes eleven (depending upon how they are arbitrarily defined and counted) arc-shaped portions 70 and nine of the turns 71 with their enlarged openings 72.

FIG. 6 also illustrates that the conductive filament 70 has a cross-section in the form of a flattened rectangle and that the arc-shaped portions 70 are in a generally concentric arrangement with one another even though they do not necessarily define concentric circles in the absolute sense of that word.

FIG. 6 also illustrates that the filament 50 includes a plurality of pin openings 73 for receiving mounting pins therethrough that limit, but do not proscribe, the expansion movement of the filament 50 at high temperatures under the influence of current flowing through the filament. As set forth elsewhere herein, one of the problems in resistive heating is the distortion that results when filaments are completely fixed in place or completely free to expand in an uncontrolled manner. By incorporating the pin openings and pins (as described elsewhere herein), the present invention allows the filament to expand and contract in a controlled fashion that avoids the problems of both fixed filaments and unrestrained filaments.

Figure 7:
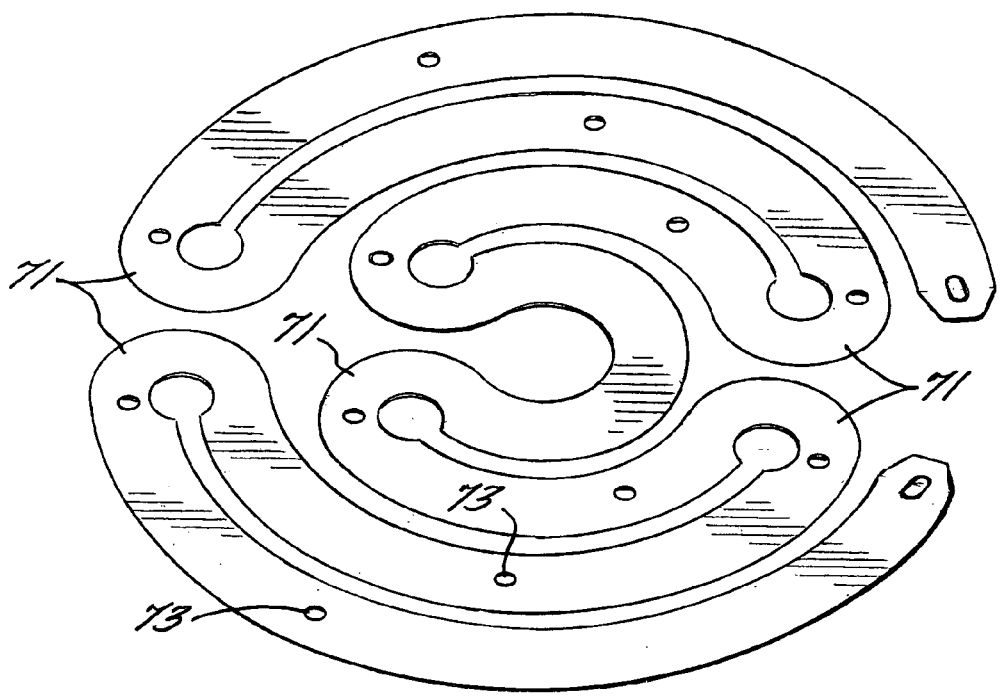
Figure 8:
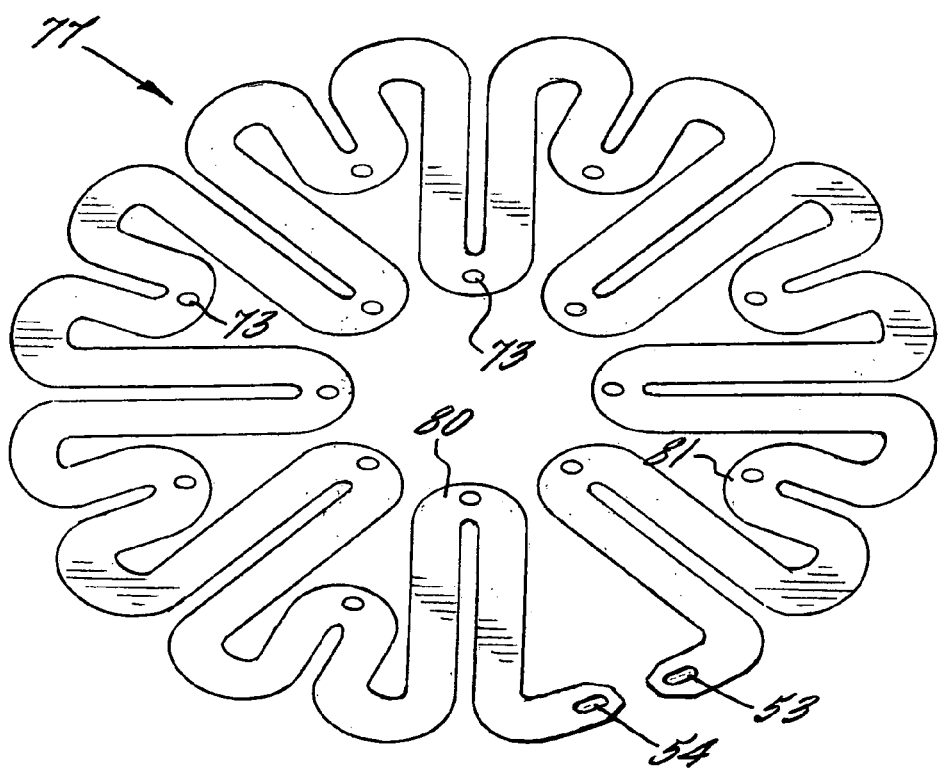
Figure 9:
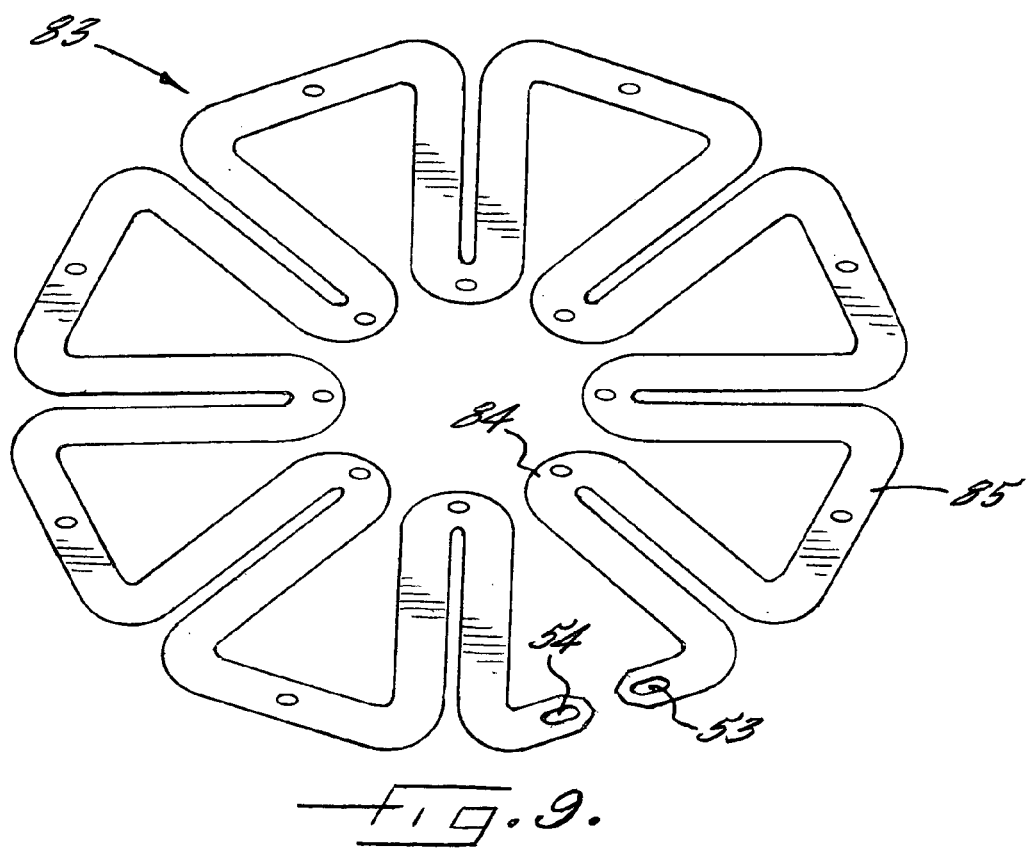

FIGS. 7 through 10 illustrate other embodiments of the filament. In particular, FIGS. 7, 8 and 9 illustrate filaments that are symmetric in some fashion. For example, in FIG. 7 the filament 68 is symmetric across a mirror plane passing perpendicularly through the electrode openings 53, 54 and the respective turns 71. A symmetrical filament offers the advantage of reducing the number of different shapes of electrode material through which current must flow. This correspondingly reduces the number of different current paths and thus reduces the resistance differences as current flows through different portions of the filament. In turn, in a manner discussed above, minimizing the resistance differences as current flows through the design correspondingly directly minimizes the resulting temperature differences. This in turn minimizes the distortion and degradation problems associated with conventional filament designs.

As illustrated in FIG. 7 and elsewhere, the edges of the filaments adjacent the electrode contact openings 53, 54 are typically formed into oblique geometries rather than rectangular ends. In a manner similar to the effect of the turns 71 in the filaments, these oblique ends help reduce localize resistance differences and thus in the current flow at these portions of the filament. This is also helpful given that current will tend to flow predominantly in one direction with respect to the electrode holes 53, 54 and is less likely to flow in the small portion between the electrode hole and the absolute end of the filament.

FIG. 8 is an example of another filament design 77 according to the invention that has the anode and cathode contacts 53, 54 as described earlier. With the exception of the contacts 53, 54, the filament 77 has a rotational symmetry of order n, where in is at least 2 for minimizing the number of shapes the filament presents to current flowing therethrough during resistance heating. In particular, the metal filament illustrated in FIG. 8 has a rotational symmetry of order 8, with the exception of the portion where the electrodes 53, 54 are present. Stated in different terms, the filament 77 in FIG. 8 is formed of two types of shapes: the longer U-shaped sections 80 and the shorter U-shaped sections 81. As just described with respect to other filament designs, reducing the overall number of different shapes in a given filament design correspondingly reduces the variation in current flow through the filament thus reduces the variations in thermal expansion and thus increases the lifetime of the filament and potentially of the reactor in which the filament is used.

FIG. 9 is another example of a filament designated at 83 that has a high order of rotational symmetry. The filament 83 again includes the anode and cathode contact openings 53, 54 and likewise is highly symmetrical and presents only the large U-shaped portions 84 and the intermediate linear perimeter or portions 85.

Figure 10:
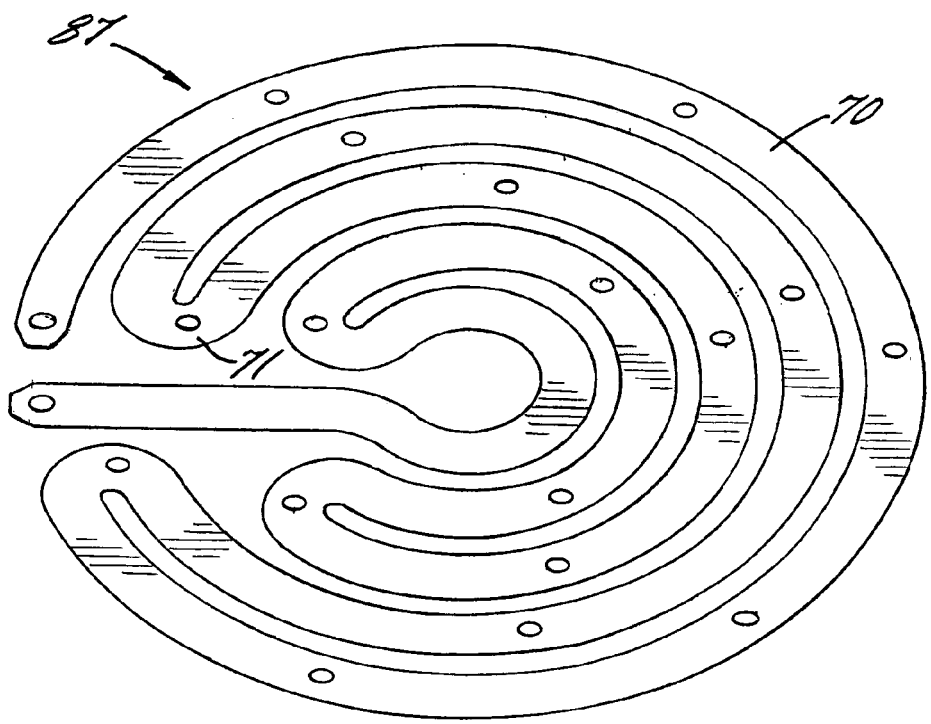

FIG. 10 is another example of a filament designated at 87 that has respective concentric portions 70 and turns 71 as previously described. This pattern, although not of high order symmetry, provides consistently arranged concentric portions that also reduce the current flow variations and thus reduce the temperature variations across this filament.

In typical embodiments, the filaments illustrated in FIGS. 6 through 10 all include the pin openings 73 so that the respective filaments can be mounted for controlled, but not unlimited, movement during expansion and contraction.

FIG. 11 illustrates an outer filament 90 functionally very similar to the one illustrated in FIG. 3, but with the closed curve plane openings 65 being positioned more along the center line of the filament.

In another aspect, the invention comprises a resistive-heated vapor deposition reactor formed of the reaction chamber 28 the gas inlets and outlets 24, 35, the filaments (e.g. 47, 50), and means for preventing the conductive filaments from unrestricted expansion and from contacting undesired portions of the reactor, heating assembly, or wafer carrier, when the filament expands and contracts under the influence of applied current in resulting temperature changes.

As illustrated for example in FIGS. 2 and 3, in some embodiments the preventing means comprises the plurality of fixed pins 67 in the chamber and the plurality of pin openings 65 or 73 in the filaments for receiving the pins 67 in the openings 73 to thereby limit the movement of the filament when the filament is heated by the application of the current therethrough. In preferred embodiments and as illustrated in FIGS. 3 and 4, the reactor 20 typically includes at least the heat shield 33 with the pins 67 either fixed to or extending from the heat shield 33.

Figure 12:
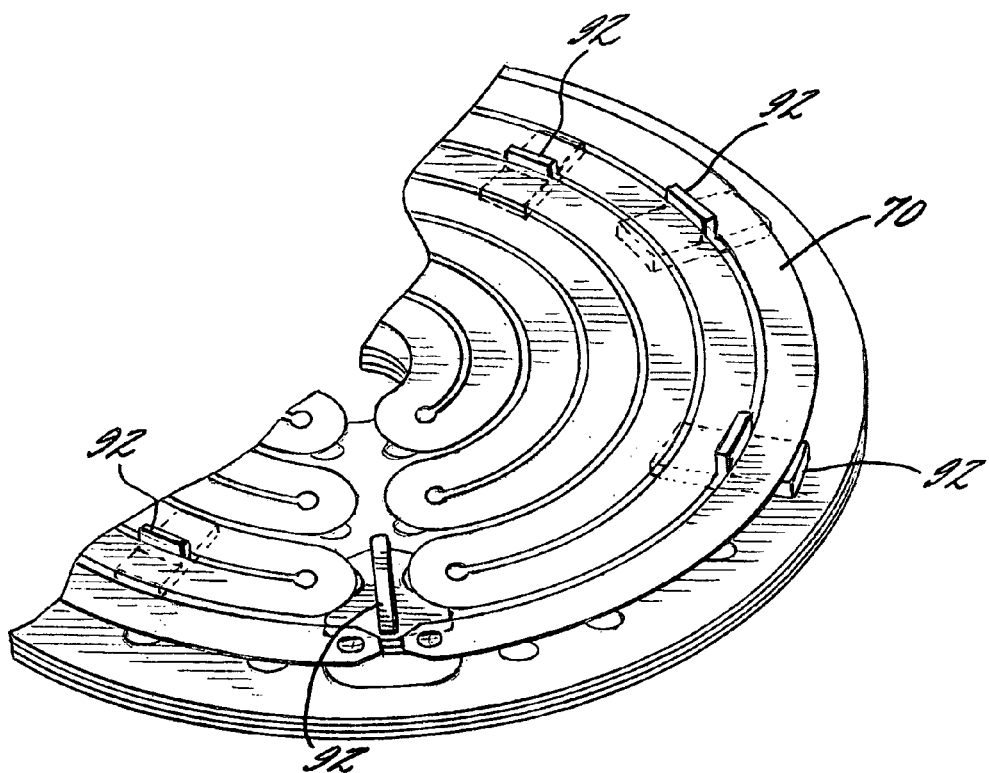
FIG. 12 is a partial perspective view of a heat shield, two filaments, and filament separators according to the present invention.

Alternatively, and as illustrated in FIG. 12, the preventing means can comprise the upwardly projecting tabs or cradles 92 that are positioned in the openings between the arc-shaped portions 70 of the filament 50. It will be understood that the shapes and positions of the tabs 92 can be selected to complement individual filaments and that the relationship among the illustrated filament 50, its arc-shaped portions 70 and the illustrated tabs 92 is exemplary rather than limiting of this structural feature and its function. The tabs 92 are formed of an insulating material with alumina being satisfactory in many cases.

In another aspect the invention is a method of increasing the lifetime and productivity of filament based resistive heated vapor deposition system. In this aspect, the method comprises heating the filament while permitting the filament to move as it expands under the effect of increasing temperature while limiting the movement of the filament to an amount that prevents the expanding movement of the filament from creating undesired contact with any portions of the reactor, including undesired expanded contact with itself across the gaps. The method prevents both undesired physical and electrical contact with other portions of the reactor and the filament.

FIG. 13 illustrates that the anode or cathode contacts on the filament 47 can be designed in a plurality of geometries in order to increase the filament lifetime and to enhance the process performance. FIG. 13(A, B, and C) is, of course, exemplary of these designs (as are for example FIGS. 7 and 8) rather than limiting.

Similarly, FIG. 14(A, B, and C) respectively illustrates additional embodiments of the turns in the filaments 47. It will likewise be understood that the turns can be optimized to minimize warping and increase the uniformity of the heating step.

In the drawings and specification there has been set forth a preferred embodiment of the invention, and although specific terms have been employed, they are used in a generic and descriptive sense only and not for purposes of limitation, the scope of the invention being defined in the claims.

The invention claimed is:

1. A conductive filament for resistive heating in vapor deposition, said filament comprising:
   a cathode contact and an anode contact;
   a plurality of adjacent arc-shaped filament portions between said contacts, said plurality of arc-shaped filament portions having a generally concentric arrangement;
   a plurality of respective semicircular turns connecting pairs of said arc-shaped filament portions, wherein a plurality of connected adjacent arc-shaped filament portions define corresponding arc-shaped openings therebetween; and
   a plurality of said semicircular turns having an enlarged inner circumference and a width across the filament portion at said turn that is less than the width across said adjacent arc-shaped filament portions for reducing the difference in resistance between the inner and outer edges of said semicircular turn as current flows through said filament between said contacts.

2. A conductive filament according to claim 1 wherein said anode and cathode contacts are openings adjacent one another and adjacent the gap that defines the two ends of the filament for current flow purposes.

3. A conductive filament according to claim 1 further comprising a plurality of pin openings for receiving mounting pins therethrough that limit, but do not proscribe, the expansion movement of said filament at high temperatures under the influence of current flowing through said filament.

4. A conductive filament according to claim 1 comprising between 4 and 16 of said turns.

5. A conductive filament according to claim 1 having a cross section in the form of a flattened rectangle.

6. A conductive filament according to claim 1 formed of a material selected from the group consisting of tungsten, rhenium, graphite, boron nitride, nickel chromium, iron nickel chromium, and silicon carbide.

* * * * *